United States Patent
Asakura et al.

(10) Patent No.: US 8,334,699 B2
(45) Date of Patent: Dec. 18, 2012

(54) BATTERY INTERNAL SHORT-CIRCUIT DETECTION APPARATUS AND METHOD, AND BATTERY PACK

(75) Inventors: Jun Asakura, Osaka (JP); Takuya Nakashima, Osaka (JP); Toshiyuki Nakatsuji, Hyogo (JP); Masato Fujikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 616 days.

(21) Appl. No.: 12/602,752

(22) PCT Filed: Jun. 4, 2008

(86) PCT No.: PCT/JP2008/001412
§ 371 (c)(1),
(2), (4) Date: Dec. 2, 2009

(87) PCT Pub. No.: WO2008/152782
PCT Pub. Date: Dec. 18, 2008

(65) Prior Publication Data
US 2010/0188050 A1    Jul. 29, 2010

(30) Foreign Application Priority Data
Jun. 11, 2007 (JP) .................................. 2007-153926

(51) Int. Cl.
*G01N 27/416* (2006.01)
*H02J 7/00* (2006.01)
*H02J 7/04* (2006.01)

(52) U.S. Cl. ........ 324/426; 324/429; 324/430; 324/434; 320/132; 320/134; 320/136; 320/152

(58) Field of Classification Search .................. 324/426
See application file for complete search history.

(56) References Cited

U.S. PATENT DOCUMENTS

| | | | |
|---|---|---|---|
| 7,422,825 B2 | 9/2008 | Inoue et al. | |
| 2006/0188785 A1 | 8/2006 | Inoue et al. | |
| 2008/0157719 A1* | 7/2008 | Koike et al. | 320/134 |
| 2008/0248394 A1 | 10/2008 | Inoue et al. | |
| 2008/0254369 A1 | 10/2008 | Inoue et al. | |

FOREIGN PATENT DOCUMENTS

| | | |
|---|---|---|
| JP | 8-083630 | 3/1996 |
| JP | 9-288155 | 11/1997 |
| JP | 10-038932 | 2/1998 |
| JP | 11-273749 | 10/1999 |
| JP | 2002-008631 | 1/2002 |
| JP | 3371301 | 1/2003 |
| JP | 2003-317810 | 11/2003 |
| JP | 2007-095421 | 4/2007 |
| WO | WO 2005/098997 | 10/2005 |

\* cited by examiner

*Primary Examiner* — Edward Tso
*Assistant Examiner* — Ahmed Omar
(74) *Attorney, Agent, or Firm* — McDermott Will & Emery LLP

(57) ABSTRACT

A battery internal short-circuit detection apparatus includes: a voltage detection unit for detecting a terminal voltage of the battery; a current detection unit for detecting a discharging current of the battery; a voltage drop and recovery detection unit for detecting a momentary voltage drop of the battery and a recovery from the voltage drop, in response to a result of detection performed by the voltage detection unit; and a determination unit for determining that an internal short circuit has occurred, when a maximum value of the discharging current detected by the current detection unit between the voltage drop and the recovery is equal to or lower than a threshold current.

13 Claims, 7 Drawing Sheets

SHORT CIRCUIT HAS OCCURRED
POSITIVE ELECTRODE Al CORE MATERIAL
HIGH-POLYMER SEPARATOR
NEGATIVE ELECTRODE BINDER
NEGATIVE ELECTRODE Cu CORE MATERIAL

SHORT-CIRCUIT PART Al IS MELTED

HIGH-POLYMER SEPARATOR IS CONTRACTED

SHORT-CIRCUIT PART Al IS MELTED

SHORT-CIRCUIT POINT IS ENLARGED
(REACTION CONTINUES)

SHORT CIRCUIT HAS OCCURRED

SHORT-CIRCUIT PART Al IS MELTED

Labels: POSITIVE ELECTRODE Al CORE MATERIAL / HIGH-POLYMER SEPARATOR / CERAMIC POROUS FILM / NEGATIVE ELECTRODE BINDER / NEGATIVE ELECTRODE Cu CORE MATERIAL

HIGH-POLYMER SEPARATOR IS CONTRACTED

EXPANSION OF SHORT-CIRCUIT POINT IS PREVENTED

BATTERY INTERNAL SHORT-CIRCUIT DETECTION APPARATUS AND METHOD, AND BATTERY PACK

RELATED APPLICATIONS

This application is the U.S. National Phase under 35 U.S.C. §371 of International Application No. PCT/JP2008/001412, filed on Jun. 4, 2008, which in turn claims the benefit of Japanese Application No. 2007-153926, filed on Jun. 11, 2007, the disclosures of which Applications are incorporated by reference herein.

TECHNICAL FIELD

The present invention relates to an apparatus and method for detecting an internal short circuit in a nonaqueous electrolyte secondary battery that has, between a negative electrode and a positive electrode thereof, a heat-resistant layer composed of a porous protective film or the like containing a resin binder and an inorganic oxide filler, a nonaqueous electrolyte olivine-type lithium iron phosphate secondary battery having an electrode plate resistance of not lower than 4 $\Omega \cdot cm^2$, or other nonaqueous electrolyte secondary battery. The present invention also relates to a battery pack.

BACKGROUND ART

Patent Document 1 and Patent Document 2, for example, describe a nonaqueous electrolyte secondary battery that has, between a negative electrode and a positive electrode thereof, a porous protective film containing a resin binder and an inorganic oxide filler. With such structure of this nonaqueous electrolyte secondary battery having a porous protective film, the occurrence of an internal short circuit is prevented even after an active material that falls off from an electrode or a waste from a cutting process adheres to the surface of the electrode at the time of manufacture of the nonaqueous electrolyte secondary battery. However, the problem of this structure is that if an internal short circuit occurs, the occurrence of the internal short circuit cannot be detected with a conventional method that uses a cell of a conventional structure without a porous protective film.

In order to explain this problem, first the conventional method that uses a cell of a conventional structure without a porous protective film is described hereinafter.

Specifically, in the case of the cell of a conventional structure without a porous protective film, when an internal short circuit occurs, the voltage of the cell drops drastically as shown in FIG. 3, and does not recover. Therefore, the internal short circuit can be detected by monitoring the voltage of the cell on a predetermined cycle or detecting a drastic increase in temperature caused by a short-circuit current.

This is caused by the following mechanism. For example, when, as shown in FIG. 4A, an internal short circuit has occurred by a metallic foreign body such as an electrode material or waste that falls off during the manufacturing process, a positive electrode aluminum core of a short-circuit part is melted by the heat generated by the short circuit, as shown in FIG. 4B. Subsequently, this heat melts and contracts the separator made of polyethylene or other high-polymer material, as shown in FIG. 4C, and enlarges the short-circuit hole as shown in FIG. 4D, whereby the short-circuit area increases. Thereafter, the short-circuit section melts, as shown in FIG. 4(e), and thus generated heat repeatedly enlarges the molten section (short-circuit hole) again, as shown in FIG. 4C. In this manner, the voltage of the cell drops drastically and the temperature of the cell increases drastically due to thermal runaway.

Patent Document 3, for example, describes that when the temperature of the battery rises due to an internal short circuit, the rise of the temperature is stored, thereby enabling a detection of an internal short circuit or the like that occurs when the battery is not operated. Patent Document 3 further describes that when a significant temperature increase with respect to a significant voltage drop is detected, it is determined that an internal short circuit has occurred. Patent Document 4 describes that an internal short circuit is detected from voltage, pressure, temperature, sound, and the like. Further, Patent Document 5 discloses that signals having a plurality of frequencies are applied from an electrode to detect an internal short circuit.

Patent Document 1: Japanese Patent Application No. 3371301
Patent Document 2: International Publication WO05/098997 Pamphlet
Patent Document 3: Japanese Unexamined Patent Application No. 118-83630
Patent Document 4: Japanese Unexamined Patent Application No. 2002-8631
Patent Document 5: Japanese Unexamined Patent Application No. 2003-317810

On the other hand, in the structure with a porous protective film as described in Patent Document 1 or Patent Document 2, when an internal short circuit occurs by a metallic foreign body such as an electrode material or waste that falls off during the manufacturing process as shown in FIG. 5A, the following case occurs. Specifically, even when the positive electrode aluminum core of the short-circuit part is melted as shown in FIG. 5B, the porous protective film prevents the positive electrode aluminum core and a negative electrode binder from coming into contact with each other. For this reason, the separator melts only in the vicinity of the region where the metallic foreign body exists, as shown in FIG. 5B to FIG. 5D, whereby the expansion of the short circuit is prevented. Thereafter, the voltage of the cell substantially recovers, and the cell can be used with a small short circuit. FIG. 6 shows changes in the voltage of the cell that occur when an internal short circuit occurs in the structure described in Patent Document 1 or Patent Document 2. The problem of the methods described in Patent Documents 3 to 5 is, therefore, that it is difficult to detect an internal short circuit.

Because a secondary battery that uses olivine type lithium iron phosphate ($LiFePO_4$) as a positive electrode material has high thermal/chemical stability and is inexpensive, this secondary battery is expected to be an alternative to a secondary battery that uses lithium cobalt oxide ($LiCoO_2$). However, because the secondary battery that uses olivine type lithium iron phosphate ($LiFePO_4$) as the positive electrode material has a low electrical conductivity and an extremely low lithium ion diffusion rate, the methods described in Patent Documents 3 to 5 cannot detect an internal short circuit, which is the same problem as that of the secondary battery with a porous protective film that is described in Patent Document 1 or Patent Document 2.

DISCLOSURE OF THE INVENTION

An object of the present invention is to provide a battery internal short-circuit detection apparatus and method capable of securely detecting an internal short circuit in a battery in which the voltage thereof does not drop drastically even when an internal short circuit occurs, and to provide a battery pack.

A battery internal short-circuit detection apparatus according to one aspect of the present invention includes: a voltage detection unit for detecting a terminal voltage of the battery; a current detection unit for detecting a discharging current of the battery; a voltage drop and recovery detection unit for detecting a momentary voltage drop of the battery and a recovery from the voltage drop, in response to a result of detection performed by the voltage detection unit; and a determination unit for determining that an internal short circuit has occurred, when a maximum value of the discharging current detected by the current detection unit between the voltage drop and the recovery is equal to or lower than a threshold current.

A battery internal short-circuit detection method according to another aspect of the present includes: a detection step of detecting a momentary voltage drop of the battery and a recovery from the voltage drop; and a determination step of determining that an internal short circuit has occurred, when a maximum value of the discharging current between the voltage drop and the recovery is equal to or lower than the threshold current.

According to the foregoing structures, even in a battery in which the voltage thereof does not drop drastically on the occurrence of an internal short circuit, the internal short circuit can be securely detected, as will be described hereinafter.

Specifically, when the voltage of the battery drops momentarily and thereafter recovers to the voltage obtained before the drop, it means that an internal short circuit is generated in the battery by the above-described mechanism and is prevented from expanding. Further, when the maximum value of the discharging current (i.e., the current of the battery that flows out) between the voltage drop and the recovery is equal to or lower than a predetermined threshold current, it can be determined that the momentary drop described above is not a result of an excessive discharge to an electrical load or a short circuit (including a soft short circuit) generated outside. Therefore, not only is it possible to detect the momentary voltage drop of the battery and the recovery from the momentary voltage drop, but also the internal short circuit can be determined securely based on the fact that the maximum value of the discharging current between the voltage drop and the recovery becomes equal to or lower than the threshold current.

The threshold current is preferably determined based on, for example, an internal resistance value of the battery estimated from the temperature of the battery, and the terminal voltage of the battery. Specifically, when the internal resistance value of the battery that is estimated from the temperature of the battery is represented by "r" and the amount of change in the terminal voltage during a predetermined time period upon the voltage drop is represented by "$\Delta V1$", it is preferred that the threshold current be determined based on $\Delta V1/r$ or $\Delta V1/r$ multiplied by a predetermined coefficient.

As a result, an appropriate threshold current can be determined in response to the temperature of the battery, and the accuracy of detecting an internal short circuit can be improved.

The object, features and advantages of the present invention will become apparent from the following detailed description and the accompanying drawings.

BEST MODE FOR CARRYING OUT THE INVENTION

Figure 1:
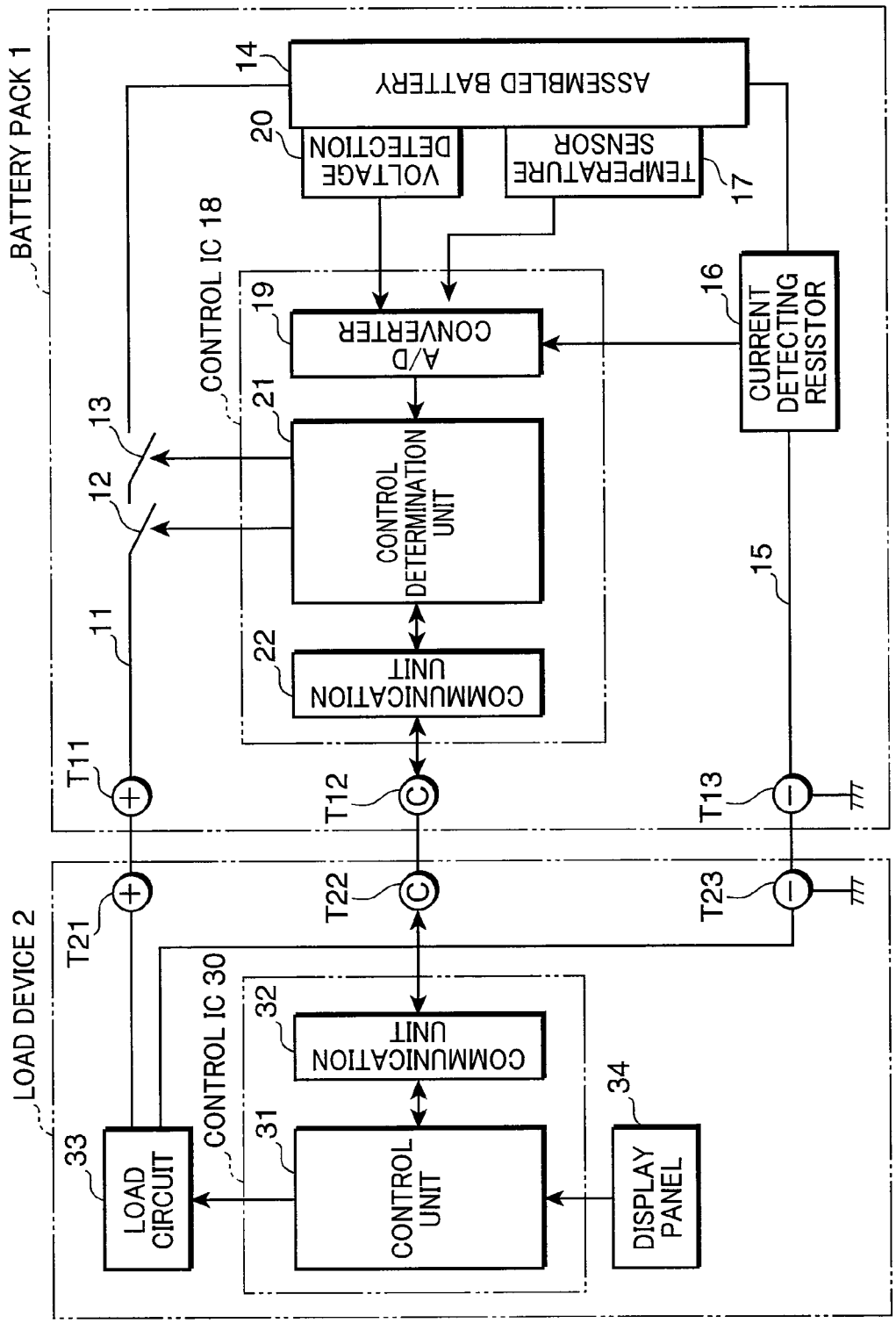
FIG. 1 is a block diagram showing an electronic structure of an electronic device system, which is an internal short-circuit detection apparatus of a nonaqueous electrolyte secondary battery according to one embodiment of the present invention.

FIG. 1 is a block diagram showing an electronic structure of an electronic device system according to one embodiment of the present invention. In this electronic device system a battery pack 1 has a load device 2 supplied with power source from the battery pack 1, and the battery pack 1 is charged by a charger, which is not shown. When charging, the battery pack 1 is mounted on the load device 2 to charge the battery pack 1 via the load device 2. The battery pack 1 and the load device 2 are connected to each other by direct current high-side terminals T11, T21 for feeding power, communication signal terminals T12, T22, and GND terminals T13, T23 for power feeding and communication signals. The charger also is provided with the same three terminals.

In the battery pack 1, FET 12, 13 with different types of conductivity for charging and discharging are interposed in a direct current high-side charge/discharge path 11 extending from the terminal T11, and this charge/discharge path 11 is connected to a high-side terminal of a secondary battery 14. A low-side terminal of the secondary battery 14 is connected to the GND terminal T13 via a direct current low-side charge/discharge path 15, and a current detecting resistor 16 for converting a charging current and a discharging current to a voltage value is interposed in the charge/discharge path 15.

The secondary battery 14 is configured by connecting a plurality of cells in a series-parallel manner, and the temperature of the cells is detected by a temperature sensor 17 and input to an analog/digital converter 19 within a control IC 18. The inter-terminal voltage of each cell is read by a voltage detection circuit 20 and input to the analog/digital converter 19 within the control IC 18. Further, a current value detected by the current detecting resistor 16 is also input to the analog/digital converter 19 within the control IC 18. The analog/ digital converter 19 converts each of the input values into a digital value and outputs the digital value to a control determination unit 21.

The control determination unit 21 has a microcomputer, peripheral circuit thereof, and the like. This control determination unit 21 computes the percentage of the remaining battery level of the secondary battery 14 in relation to the fully charged secondary battery 14, in response to each input value obtained from the analog/digital converter 19, and then transmits the calculated result from a communication unit 22 to the load device 2 via the terminals T12, T22; T13, T23. Furthermore, based on each input value obtained from the analog/digital converter 19, the control determination unit 21 computes the voltage value and the current value of the charging current for requesting the charger for an output, and transmits the calculated values from the communication unit 22 via the terminal T12. Based on each input value, the control determination unit 21 further detects a short circuit between the terminals T11 and T13 or an abnormality outside the battery pack 1, such as an abnormal current, and detects an abnormality such as an internal short circuit of the secondary battery 14. Once these abnormalities are detected, the control determination unit 21 performs a protection operation to block the FET 12, 13.

In the load device 2, a communication unit 32 of a control IC 30 receives the remaining battery level of the secondary battery 14, and a control unit 31 computes the remaining time of use of the battery pack 1 from the power consumption of various load circuits 33 and displays the computed remaining time of use on a display panel 34. The control unit 31 controls the various load circuits 33 in response to an input of an input operation apparatus, which is not shown.

With the foregoing structure of the battery pack 1 of the present embodiment, the secondary battery 14 is constituted by a nonaqueous electrolyte secondary battery having a heat-resistant layer (porous protective film) between a negative electrode and a positive electrode as shown in FIG. 5, or a nonaqueous electrolyte olivine type lithium iron phosphate secondary battery having an electrode plate resistance of not lower than 4 $\Omega \cdot cm^2$. It should be noted that the control determination unit 21 (the voltage drop and recovery detection unit, the determination unit) determines, in the following manner, whether or not an internal short circuit has occurred in the secondary battery 14, in response to the results of detection performed by the voltage detection circuit 20 (voltage detection unit), the current detecting resistor 16 (current detection unit), and the temperature sensor 17, when the battery is in a standby state and a discharge state.

Figure 7:
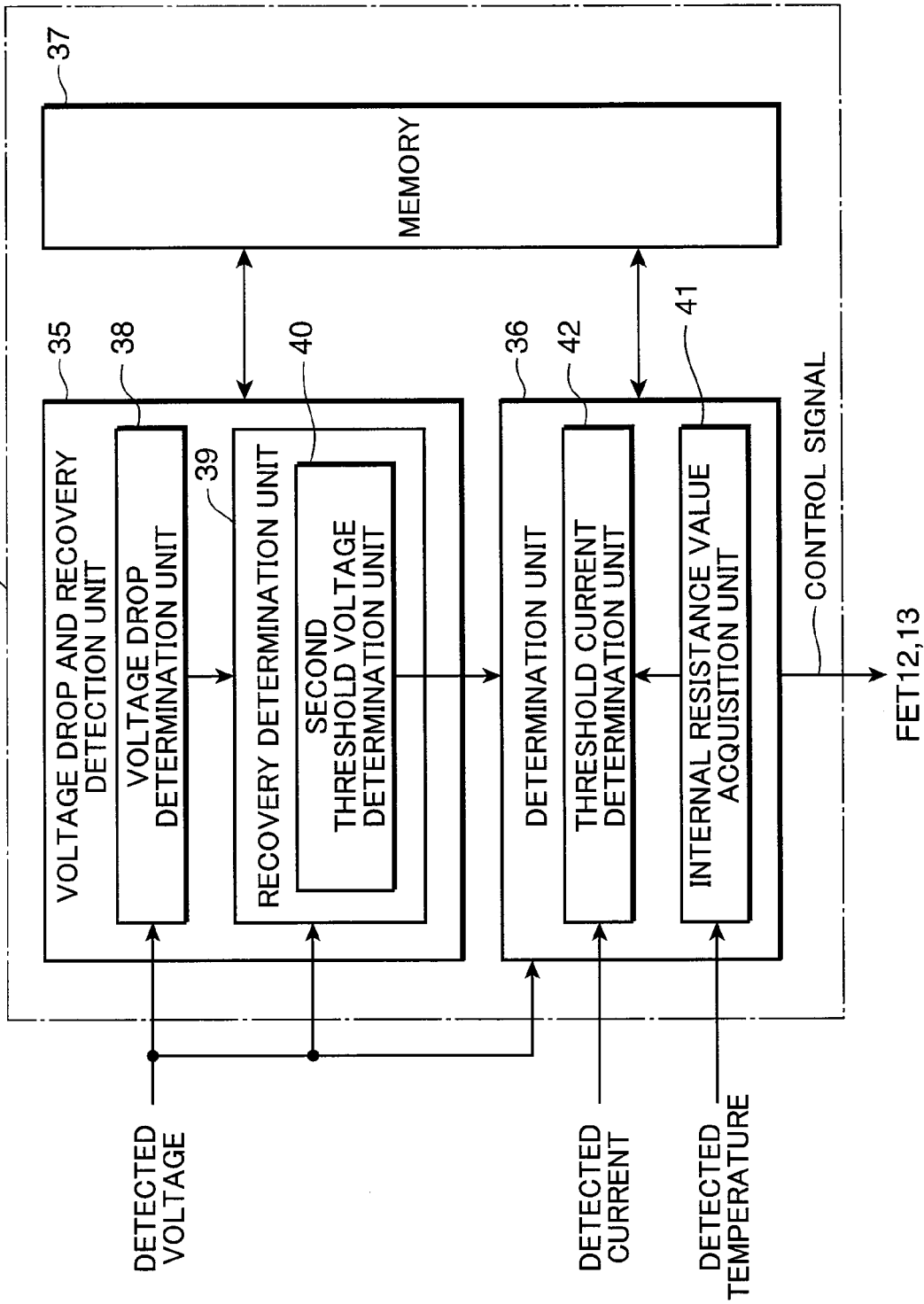
FIG. 7 is a functional block diagram of the internal short-circuit detection apparatus of the battery according to the embodiment of the present invention.

FIG. 7 shows a functional block diagram of the control determination unit 21. The control determination unit 21 has a voltage drop and recovery detection unit 35, a determination unit 36, and a memory 37, which are described hereinafter.

The voltage drop and recovery detection unit 35 has a function of detecting a momentary voltage drop of the secondary battery 14 and a recovery from the momentary voltage drop, in response to the result of detection performed by the voltage detection circuit 20. The determination unit 36 has a function of determining that an internal short circuit occurs, when the maximum value of the discharging current detected by the current detecting resistor 16 between the voltage drop and the recovery is equal to or lower than a threshold current Ith. The memory 37 stores therein data on first threshold voltage-Vth1 and an operation program, as described hereinafter. The memory 37 also has a storage region for temporarily storing various data, such as computational result data of the voltage drop and recovery detection unit 35 and the determination unit 36.

The voltage drop and recovery detection unit 35 has a voltage drop determination unit 38 and a recovery determination unit 39. The voltage drop determination unit 38 has a function of detecting the amount of change $\Delta V1$ in the terminal voltage during a predetermined time period and determining that a momentary voltage drop has occurred when the absolute value of the amount of change $\Delta V1$ in the terminal voltage exceeds the absolute value Vth1 of the first threshold voltage. The recovery determination unit 39 has a function of determining that the voltage recovers from the voltage drop, when the terminal voltage exceeds a second threshold voltage Vth2 after the occurrence of the voltage drop.

The recovery determination unit 39 has a second threshold voltage determination unit 40 that multiplies the voltage obtained at the time of the start of the voltage drop, by a predetermined coefficient, to determine the second threshold voltage Vth2 used for determining the recovery.

The determination unit 36 has an internal resistance value acquisition unit 41 and a threshold current determination unit 42. The internal resistance value acquisition unit 41 has a function of obtaining the internal resistance value r of the secondary battery 14 from the temperature of the secondary battery 14 detected by the temperature sensor 17. The threshold current determination unit 42 has a function of determining the threshold current Ith based on the internal resistance value r obtained by the internal resistance value acquisition unit 41 and the terminal voltage of the battery.

Each function of the control determination unit 21 is realized by a CPU, a storage device (ROM, RAM) and the like of the microcomputer.

Figure 2:
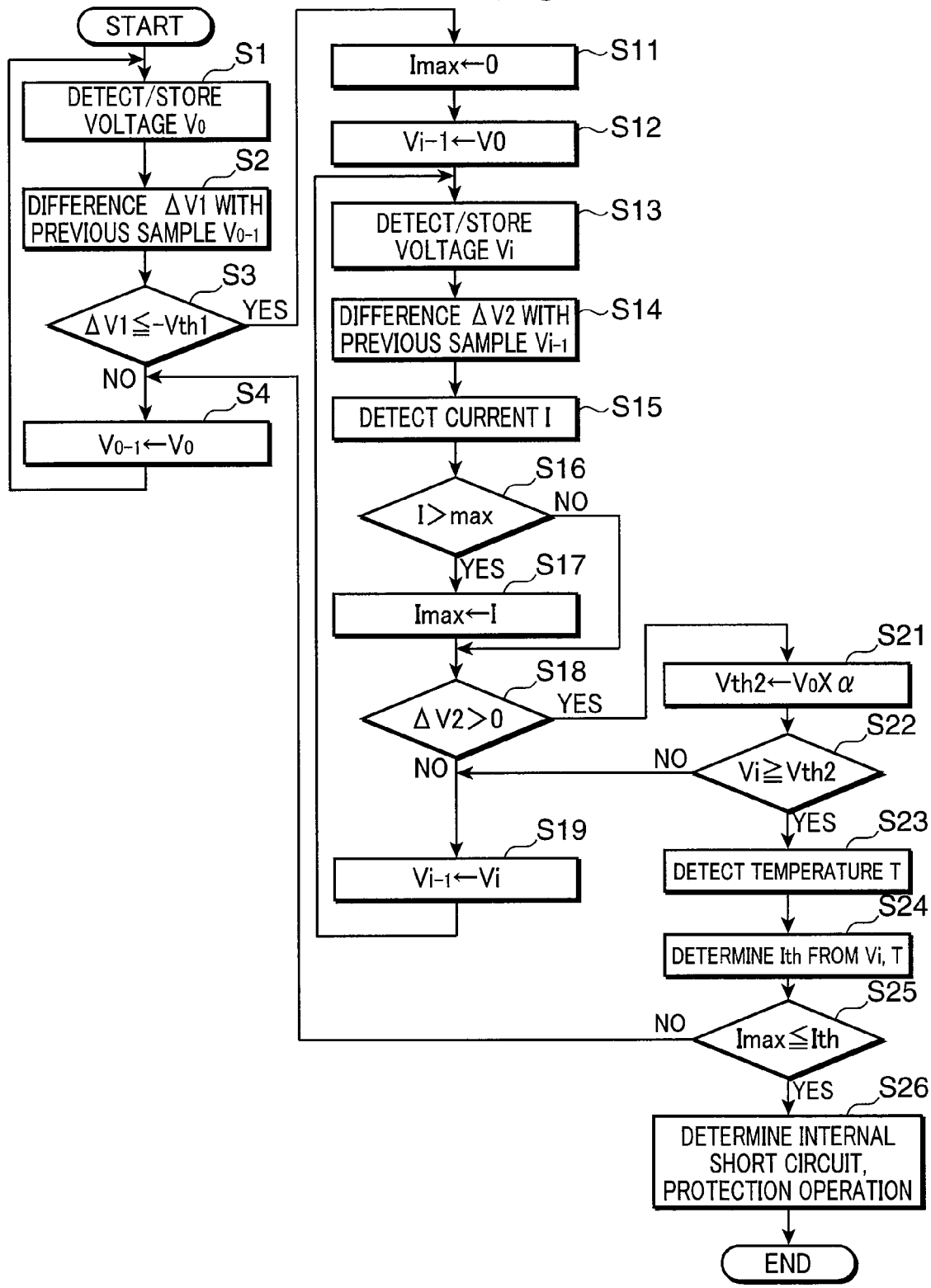
FIG. 2 is a flowchart for explaining in detail an internal short circuit determination operation according to the embodiment of the present invention.
Figure 3:
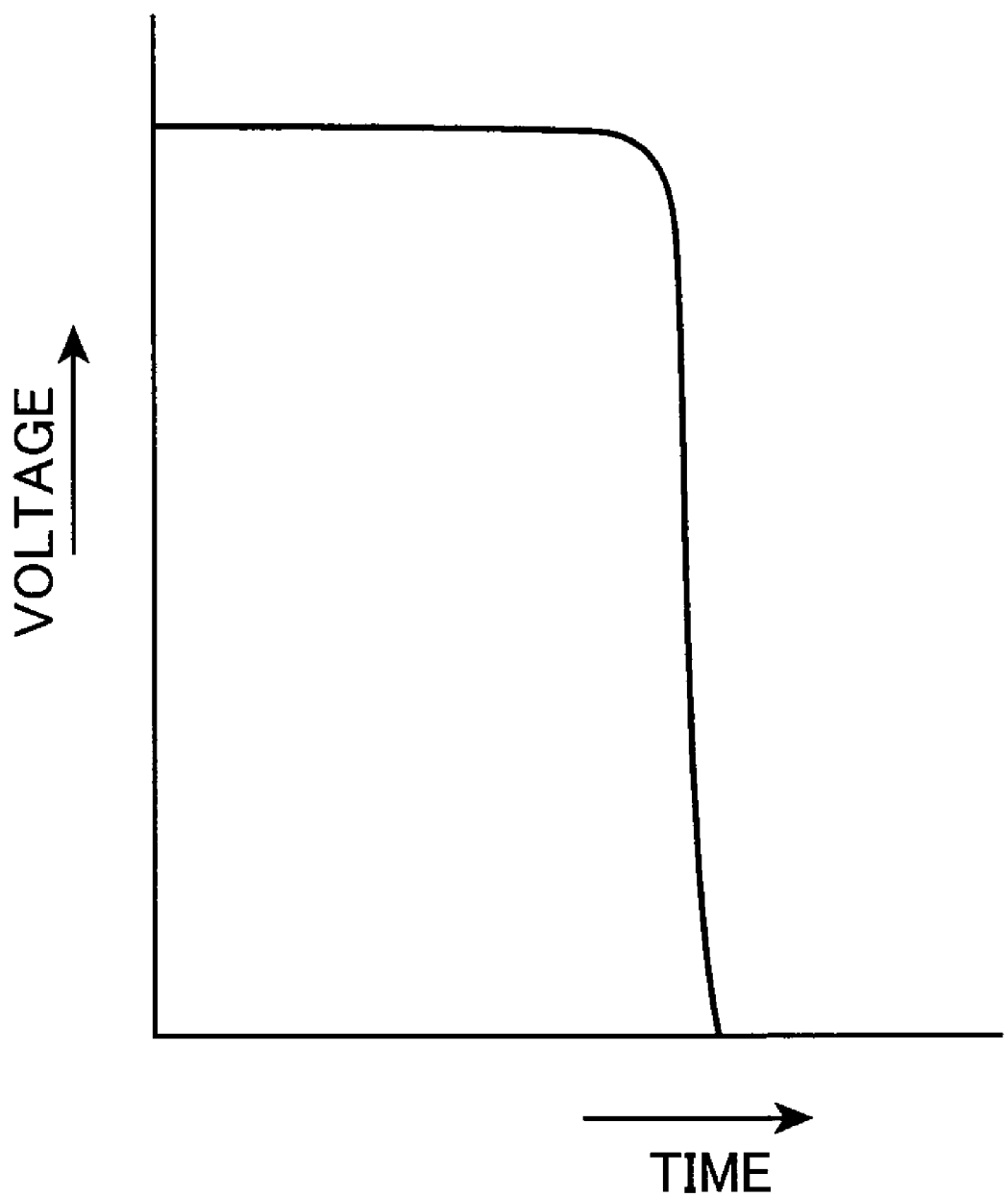
FIG. 3 is a graph showing changes in voltage caused when an internal short circuit occurs in a secondary battery cell of a conventional structure.
Figure 4A:
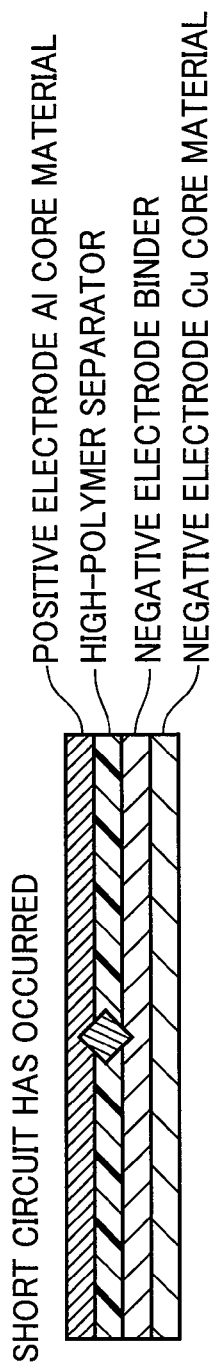
FIG. 4 is a schematic cross-sectional diagram for explaining a phenomenon occurring in an internal short-circuit section of the secondary battery cell of the conventional structure.
Figure 4B:
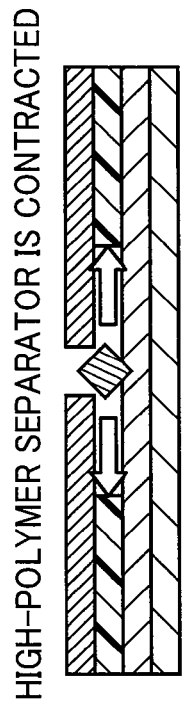
Figure 4C:
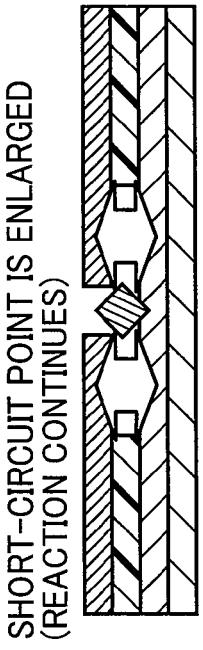
Figure 4D:
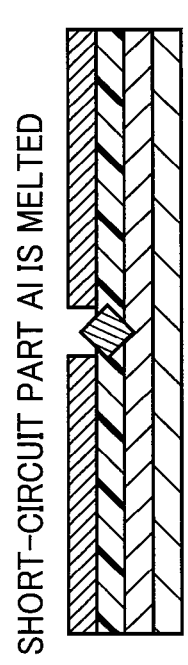
Figure 4E:
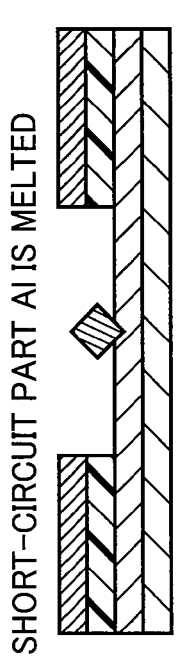
Figure 5A:
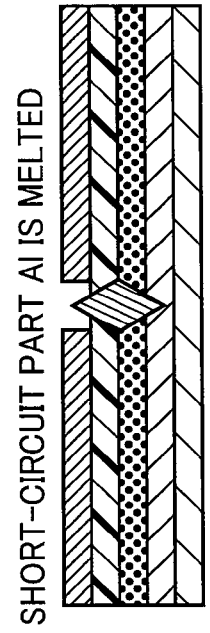
FIG. 5 is a schematic cross-sectional diagram for explaining a phenomenon occurring in an internal short-circuit section of a nonaqueous electrolyte secondary battery cell that has, between the negative electrode and the positive electrode thereof, the heat-resistant layer composed of the porous protective film containing the resin binder and inorganic oxide filler.
Figure 5B:
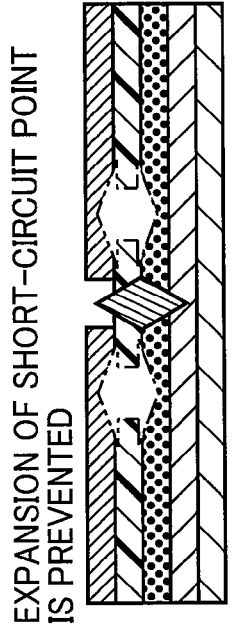
Figure 5C:
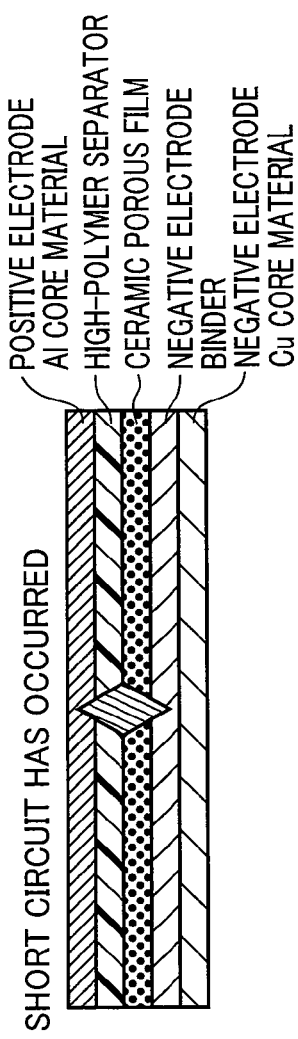
Figure 5D:
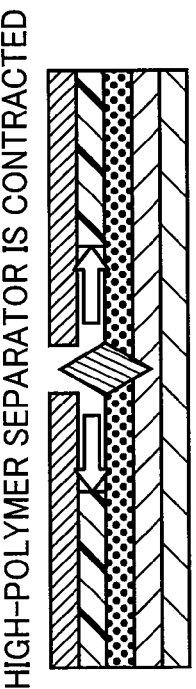

FIG. 2 is a flowchart for explaining in detail a determination operation performed by the control determination unit 21. In step S1, the control determination unit 21 loads the result of detection performed by the voltage detection circuit 20, via the analog/digital converter 19, and stores the loaded result as a voltage Vo. In step S2, the control determination unit 21 obtains the amount of change $\Delta V1$ between the voltage Vo stored this time and a voltage Vo-1 stored previously. Then, in step S3, the control determination unit 21 determines whether or not the amount of change $\Delta V1$ is equal to or lower than the predetermined first threshold voltage-Vth1. If the result of step S3 is NO, the process is moved to step S4 to update the present voltage Vo to the voltage Vo-1, and thereafter the process returns to step S1 described above. When, on the other hand, the result of step S3 is YES, it is determined that the momentary voltage drop has occurred when the absolute value of the amount of change $\Delta V1$ exceeds the absolute value Vth1 of the first threshold voltage, and the process is moved to step S11.

Each of the steps above is executed by the voltage drop determination unit 38 of the voltage drop and recovery detection unit 35 shown in FIG. 7.

As shown in FIG. 2, in step S11, the maximum current value Imax described hereinafter is initialized to 0, and the present voltage Vo described above is updated to a previous voltage Vi-1 in step S12. In step S13, the result of detection performed by the voltage detection circuit 20 is loaded again and stored as a voltage Vi. In step S14, as with step S2, the difference $\Delta V2$ between the voltage Vi stored this time and the previously stored voltage Vi-1 is obtained.

In the subsequent step S15, the current detecting resistor 16 detects a current I, and in the subsequent step S16 it is determined whether or not the present current value I exceeds the maximum current value Imax of the past. When the result of step S16 is YES, the current value I is updated to the maximum current value Imax in step S17, and thereafter the process is moved to step S18. When, on the other hand, the result of step S16 is NO, the process is moved directly to step S18 without updating the maximum current value Imax.

In step S18, it is determined whether or not the difference ΔV2 is greater than 0, that is, whether or not the dropped voltage recovers. When the result of step S18 is NO, it is determined that the voltage drops continuously, the present voltage Vi is updated to the previous voltage Vi-1 in step S19, and thereafter the process is returned to step S13. When, on the other hand, the result of step S18 is YES, it is determined that the voltage recovers, and the process is moved to step S21.

In step S21, the predetermined coefficient α, α=0.9, is multiplied by the voltage Vo obtained at the time of the start of the voltage drop, whereby the second threshold voltage Vth2 is obtained as a reference value for determining the recovery. Specifically, the voltage equivalent to 90% of the voltage Vo at the time of the start of the voltage drop is taken as the second threshold voltage Vth2. This is because it can be determined that the voltage recovers from the voltage drop when the voltage Vo obtained at the time of the start of the voltage drop recovers 90%. Note in the present embodiment that α is equal to 0.9, but the coefficient α can also be set at a value greater than or smaller than 0.9 in accordance with the characteristics of the target battery. This step S21 is executed by the second threshold voltage determination unit 40 of the recovery determination unit 39 shown in FIG. 7.

In the subsequent step S22, it is determined whether or not the present voltage Vi becomes equal to or greater than the second threshold voltage Vth2, as shown in FIG. 2. When the result of step S22 is NO, the process is moved to step S19 to update the present voltage Vi to the previous voltage Vi-1, and thereafter the process is returned to step S13. When, on the other hand, the result of step S22 is YES, it is determined that the voltage recovers from the voltage drop, and then the process is moved to step S23. This step S21 is executed by the recovery determination unit 39 shown in FIG. 7.

Figure 6:
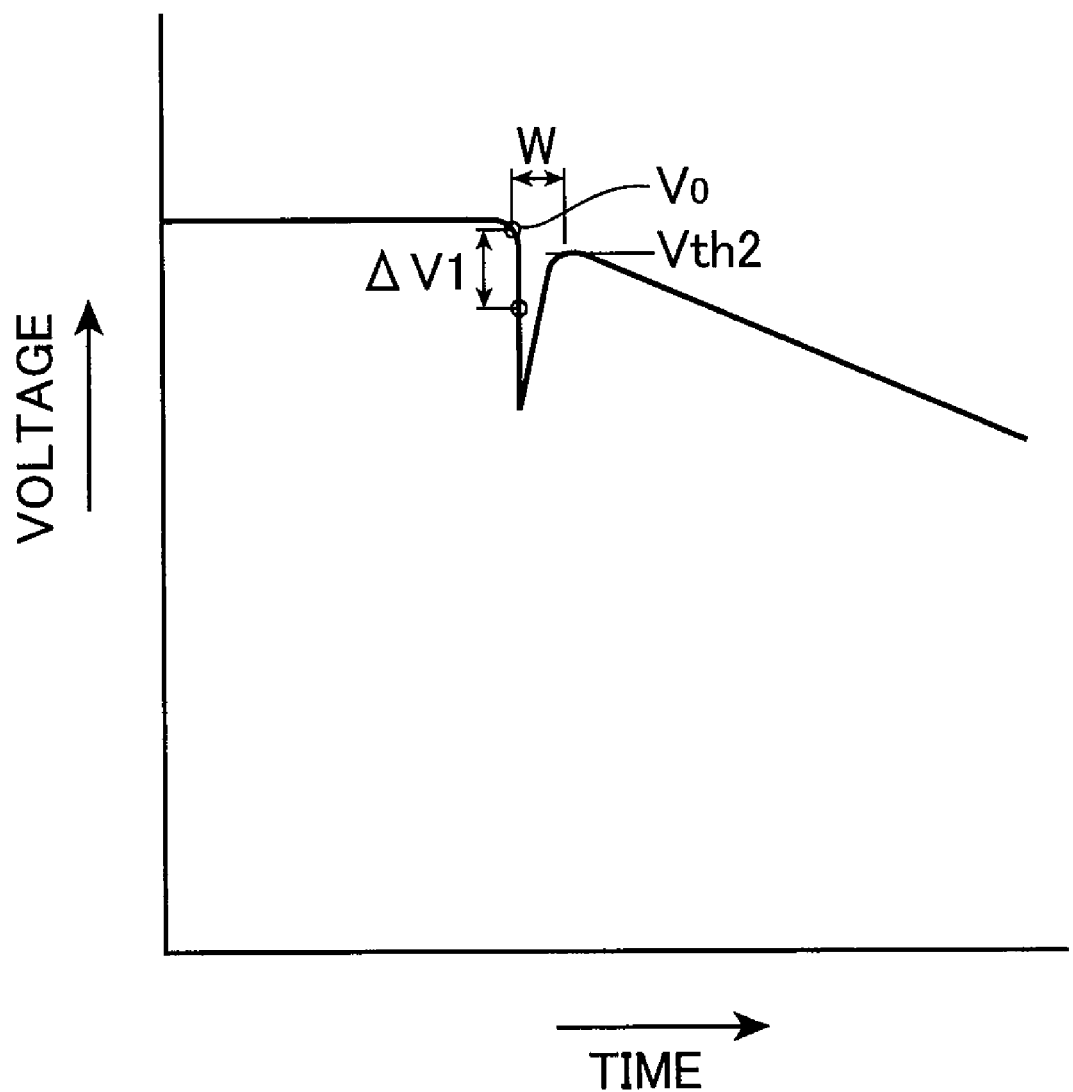
FIG. 6 is a graph showing changes in voltage caused when an internal short circuit occurs in the nonaqueous electrolyte secondary battery cell that has, between the negative electrode and the positive electrode thereof, the heat-resistant layer composed of the porous protective film containing the resin binder and inorganic oxide filler.

FIG. 6 shows the relationship among the voltage Vo, the difference ΔV1, and the second threshold voltage Vth2.

In step S23, the temperature sensor 17 detects a cell temperature T, as shown in FIG. 2. In the subsequent step S24, the internal resistance value r of the secondary battery 14 that is estimated from the cell temperature T is obtained. In addition, in step S24, the threshold current Ith for determining an external short circuit and an internal short circuit is obtained based on the obtained internal resistance value r and the amount of change ΔV1 in the terminal voltage (the amount of change ΔV1 in the terminal voltage, which exceeds the first threshold voltage Vth1 and obtained at the time of the voltage drop). Specifically, the threshold current Ith is obtained based on ΔV1/r. Note that the threshold current Ith can also be obtained by multiplying ΔV1/r by a predetermined coefficient. This step S24 is executed by the internal resistance value acquisition unit 41 and the threshold current determination unit 42 shown in FIG. 7.

In order to obtain the internal resistance value r of the secondary battery 14 from the cell temperature T in step S24, the internal resistance value r may be computed from a temperature coefficient of the internal resistance of the secondary battery 14 and the cell temperature T detected by the temperature sensor 17. Further, a look-up table showing the correspondence relation between the cell temperature T and the internal resistance value r may be stored in the memory 37, and the internal resistance value r corresponding to the cell temperature T detected by the temperature sensor 17 may be acquired from the look-up table.

In the subsequent step S25, it is determined whether or not the discharging current is equal to or lower than the threshold current Ith during a time period W (see FIG. 6) between the voltage drop to the recovery, as shown in FIG. 2. When the result of step S25 is NO (that is, when the maximum current value Imax exceeds the threshold current Ith), it is determined that a drastic power consumption of the load device 2 or a short circuit (including a soft short circuit) between the terminals T11, T13 is caused, the process is moved to step S4 to update the present voltage Vi to the previous voltage Vo-1, and thereafter the process is returned to step S1. When, on the other hand, the result of step S25 is YES, it is determined that the internal short circuit shown in FIG. 5 has occurred, and the process is moved to step S26 to perform the protection operation for turning the FET 12, 13 OFF. In this case, it is preferred that the occurrence of the internal short circuit be reported to the load device 2 via the communication units 22, 32, or that an alarm operation be performed by displaying the internal short circuit on an indicator, not shown, when the indicator is provided.

With the foregoing structure, in a case in which the non-aqueous electrolyte secondary battery that has, between the negative electrode and the positive electrode thereof, the heat-resistant layer composed of a porous protective film or the like containing a resin binder and an inorganic oxide filler, or the nonaqueous electrolyte olivine-type lithium iron phosphate secondary battery having an electrode plate resistance of not lower than 4 Ω·cm² is used as the secondary battery 14, even when an internal short circuit occurs, a state where the cell voltage drastically drops as in a normal secondary battery does not occur. Therefore, a problem in the conventional method is that it is that it is difficult to detect an internal short circuit from sample vales of data, such as the voltage, current and temperature of the secondary battery.

The battery internal short-circuit detection apparatus or method according to the present embodiment, however, not only detect a temporal change in the voltage of the secondary battery 14 (that is, a temporal change in which the cell voltage Vo momentarily drops and thereafter substantially recovers to the voltage Vth2 obtained before the drop), but also detect that discharging current Ii is equal to or lower than the predetermined threshold current Ith during the temporal change, and determine that an internal short circuit has occurred, as described above. Therefore, even in a battery in which the voltage thereof does not drop drastically on the occurrence of an internal short circuit, the internal short circuit can be securely detected.

Moreover, because the current flowing through the internal resistance flows out of the secondary battery 14, the value of current flowing out can be obtained by dividing the cell voltage Vo, Vi by the internal resistance value of the secondary battery 14 that is estimated from the cell temperature T as described above (obtained by computation etc.). Further, the external short circuit and the internal short circuit can be securely discriminated from each other and determined by determining the threshold current Ith by multiplying the obtained current value by a predetermined coefficient, and, as a result, the accuracy of determining the internal short circuit can be improved.

Note that the battery internal short-circuit detection apparatus or device of the present embodiment can be suitably used in the nonaqueous electrolyte secondary battery that has the heat-resistant layer between the negative electrode and the positive electrode, as well as in the nonaqueous electrolyte secondary battery having an electrode plate resistance of not lower than 4 Ω·cm², but the batteries in which the battery internal short-circuit detection apparatus or method can be used is not limited to these batteries. In other words, the battery internal short-circuit detection apparatus or method according to the present embodiment can be suitably used to a battery as long as it is a battery in which the voltage thereof does not drop drastically even on the occurrence of an internal short circuit.

Although the present embodiment describes the aspect in which the battery internal short-circuit detection apparatus is embedded in the battery pack, the internal short-circuit detection apparatus may be incorporated in the load device.

INDUSTRIAL APPLICABILITY

The present invention can be suitably used in charging systems used as battery built-in devices, such as electronic devices including portable personal computers, digital cameras and cellular phones, and vehicles including electric vehicles and hybrid cars. The present invention can be suitably used also in battery packs used as power sources of battery built-in devices, as well as battery chargers for charging such battery packs.

The invention claimed is:

1. A battery internal short-circuit detection apparatus, comprising:
    a voltage detection unit for detecting a terminal voltage of the battery;
    a current detection unit for detecting a discharging current of the battery;
    a voltage drop and recovery detection unit for detecting a momentary voltage drop of the battery and a recovery from the voltage drop, in response to a result of detection performed by the voltage detection unit; and
    a determination unit for determining that an internal short circuit has occurred, when a maximum value of the discharging current detected by the current detection unit between the voltage drop and the recovery is equal to or lower than a threshold current.

2. The battery internal short-circuit detection apparatus according to claim 1, wherein the voltage drop and recovery detection unit includes:
    a voltage drop determination unit for detecting the amount of change in the terminal voltage during a predetermined time period and determining that the momentary voltage drop has occurred when the amount of change in the terminal voltage exceeds a first threshold voltage; and
    a recovery determination unit for determining that the voltage recovers from the voltage drop, when the terminal voltage exceeds a second threshold voltage after the occurrence of the voltage drop.

3. The battery internal short-circuit detection apparatus according to claim 2, wherein the recovery determination unit includes a second threshold voltage determination unit that multiplies a voltage obtained at the time of the start of the voltage drop, by a predetermined coefficient, to determine the second threshold voltage used for determining the recovery.

4. The battery internal short-circuit detection apparatus according to claim 1, further comprising:
    a temperature sensor for detecting the temperature of the battery, wherein
    the determination unit includes an internal resistance value acquisition unit for obtaining an internal resistance value of the battery from the temperature of the battery detected by the temperature sensor, and a threshold current determination unit for determining the threshold current based on the internal resistance value obtained by the internal resistance value acquisition unit and the terminal voltage of the battery.

5. The battery internal short-circuit detection apparatus according to claim 4, wherein when the internal resistance value of the battery that is estimated from the temperature of the battery is represented by "r" and the amount of change in the terminal voltage during a predetermined time period upon the voltage drop is represented by "$\Delta V1$", the threshold current determination unit determines the threshold current based on $\Delta V1/r$.

6. The battery internal short-circuit detection apparatus according to claim 1, wherein the battery is a nonaqueous electrolyte secondary battery that has a heat-resistant layer between a negative electrode and a positive electrode, or a nonaqueous electrolyte secondary battery having an electrode plate resistance of not lower than $4\ \Omega\cdot cm^2$.

7. A battery pack, comprising:
    a battery; and
    an internal short-circuit detection apparatus, which has voltage detection means for detecting a voltage of the battery, current detection means for detecting a discharging current, voltage drop and recovery detection means for detecting a momentary voltage drop of the battery and a recovery from the voltage drop, in response to a result of detection performed by the voltage detection means, and determination means for determining that an internal short circuit has occurred, when a maximum value of the discharging current detected by the current detection means between the voltage drop and the recovery is equal to a threshold current.

8. A battery internal short-circuit detection method, comprising:
    a detection step of detecting a momentary voltage drop of the battery and a recovery from the voltage drop; and
    a determination step of determining that an internal short circuit has occurred, when a maximum value of a discharging current between the voltage drop and the recovery is equal to or lower than a threshold current.

9. The battery internal short-circuit detection method according to claim 8, wherein the detection step includes:
    a voltage drop determination step of detecting the amount of change in a terminal voltage of the battery during a predetermined time period and determining that the momentary voltage drop has occurred when the amount of change in the terminal voltage exceeds a first threshold voltage; and
    a recovery determination step of determining that the voltage recovers from the voltage drop, when the terminal voltage exceeds a second threshold voltage after the occurrence of the voltage drop.

10. The battery internal short-circuit detection method according to claim 9, wherein the recovery determination step includes a step of multiplying a voltage obtained at the time of the start of the voltage drop, by a predetermined coefficient, to determine the second threshold voltage used for determining the recovery.

11. The battery internal short-circuit detection method according to claim 8, wherein the determination step includes a threshold current determination step of determining the threshold current based on an internal resistance value of the battery that is estimated from the temperature of the battery, and the terminal voltage of the battery.

12. The battery internal short-circuit detection method according to claim 11, wherein when the internal resistance value of the battery that is estimated from the temperature of the battery is represented by "r" and the amount of change in the terminal voltage during a predetermined time period upon the voltage drop is represented by "$\Delta V1$", the threshold current is determined based on $\Delta V1/r$ in the threshold current determination step.

13. The battery internal short-circuit detection method according to claim 8, wherein the battery is a nonaqueous electrolyte secondary battery that has a heat-resistant layer between a negative electrode and a positive electrode, or a nonaqueous electrolyte secondary battery having an electrode plate resistance of not lower than 4 $\Omega \cdot cm^2$.

* * * * *